US011978668B2

(12) United States Patent
He et al.

(10) Patent No.: US 11,978,668 B2
(45) Date of Patent: May 7, 2024

(54) INTEGRATED CIRCUIT DEVICES INCLUDING A VIA AND METHODS OF FORMING THE SAME

(71) Applicant: Samsung Electronics Co., Ltd., Suwon-si (KR)

(72) Inventors: Ming He, San Jose, CA (US); Harsono Simka, Saratoga, CA (US); Anthony Dongick Lee, Hwasung Si (KR); Seowoo Nam, Seoul (KR); Sang Hoon Ahn, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 183 days.

(21) Appl. No.: 17/546,470

(22) Filed: Dec. 9, 2021

(65) Prior Publication Data
US 2023/0074982 A1 Mar. 9, 2023

Related U.S. Application Data

(60) Provisional application No. 63/242,193, filed on Sep. 9, 2021.

(51) Int. Cl.
*H01L 21/768* (2006.01)
*H01L 21/3105* (2006.01)
(Continued)

(52) U.S. Cl.
CPC .. *H01L 21/76895* (2013.01); *H01L 21/31053* (2013.01); *H01L 21/31111* (2013.01);
(Continued)

(58) Field of Classification Search
CPC ......... H01L 21/76895; H01L 21/31053; H01L 21/31111; H01L 21/31144; H01L 21/76805; H01L 21/76819; H01L 21/76829; H01L 21/76834; H01L 21/76897; H01L 21/76885;
(Continued)

(56) References Cited

U.S. PATENT DOCUMENTS 7,354,856 B2 4/2008 Yeh et al.
7,480,990 B2 1/2009 Fitzsimmons et al.
(Continued)

OTHER PUBLICATIONS

Extended European Search Report corresponding to EP 22178086.9; dated Dec. 1, 2022 (7 pages).

*Primary Examiner* — Shahed Ahmed
*Assistant Examiner* — Vicki B. Booker
(74) *Attorney, Agent, or Firm* — Myers Bigel, P.A.

(57) ABSTRACT

Integrated circuit devices including a via and methods of forming the same are provided. The methods may include forming a conductive wire structure on a substrate. The conductive wire structure may include a first insulating layer and a conductive wire stack in the first insulating layer, and the conductive wire stack may include a conductive wire and a mask layer stacked on the substrate. The method may also include forming a recess in the first insulating layer by removing the mask layer, the recess exposing the conductive wire, forming an etch stop layer and then a second insulating layer on the first insulating layer and in the recess of the first insulating layer, and forming a conductive via extending through the second insulating layer and the etch stop layer and contacting the conductive wire.

17 Claims, 16 Drawing Sheets

(51) Int. Cl.
*H01L 21/311* (2006.01)
*H01L 23/532* (2006.01)
*H01L 23/535* (2006.01)

(52) U.S. Cl.
CPC .. *H01L 21/31144* (2013.01); *H01L 21/76805* (2013.01); *H01L 21/76819* (2013.01); *H01L 21/76829* (2013.01); *H01L 23/53242* (2013.01); *H01L 23/53257* (2013.01); *H01L 23/535* (2013.01)

(58) Field of Classification Search
CPC ......... H01L 23/53242; H01L 23/53257; H01L 23/535; H01L 23/5226
See application file for complete search history.

(56) References Cited

U.S. PATENT DOCUMENTS

| | | | |
|---|---|---|---|
| 7,635,645 B2 | 12/2009 | Lee et al. | |
| 7,691,740 B2 | 4/2010 | Yoshizawa et al. | |
| 8,048,811 B2 | 11/2011 | Feustel et al. | |
| 8,278,205 B2 | 10/2012 | Matsuoka | |
| 9,263,331 B2 | 2/2016 | Indrakanti et al. | |
| 9,484,257 B2 | 11/2016 | Yao et al. | |
| 9,576,894 B2 | 2/2017 | Singh et al. | |
| 9,627,215 B1 | 4/2017 | Huang et al. | |
| 10,032,643 B2 | 7/2018 | Chawla et al. | |
| 10,157,790 B1 * | 12/2018 | You | H01L 21/31144 |
| 10,347,528 B1 | 7/2019 | Singh et al. | |
| 10,354,912 B2 | 7/2019 | Xu et al. | |
| 10,566,232 B2 | 2/2020 | Shen et al. | |
| 11,049,763 B2 | 6/2021 | Chen et al. | |
| 2013/0320544 A1 * | 12/2013 | Lin | H01L 21/76834 257/E21.585 |
| 2014/0117558 A1 | 5/2014 | Boyanov | |
| 2015/0130073 A1 | 5/2015 | Sung | |
| 2017/0186682 A1 * | 6/2017 | Anderson | H01L 21/31053 |
| 2019/0363048 A1 | 11/2019 | Zhao et al. | |
| 2020/0135560 A1 | 4/2020 | Clevenger et al. | |
| 2021/0098264 A1 | 4/2021 | Huang et al. | |
| 2021/0375751 A1 | 12/2021 | Dai et al. | |

\* cited by examiner

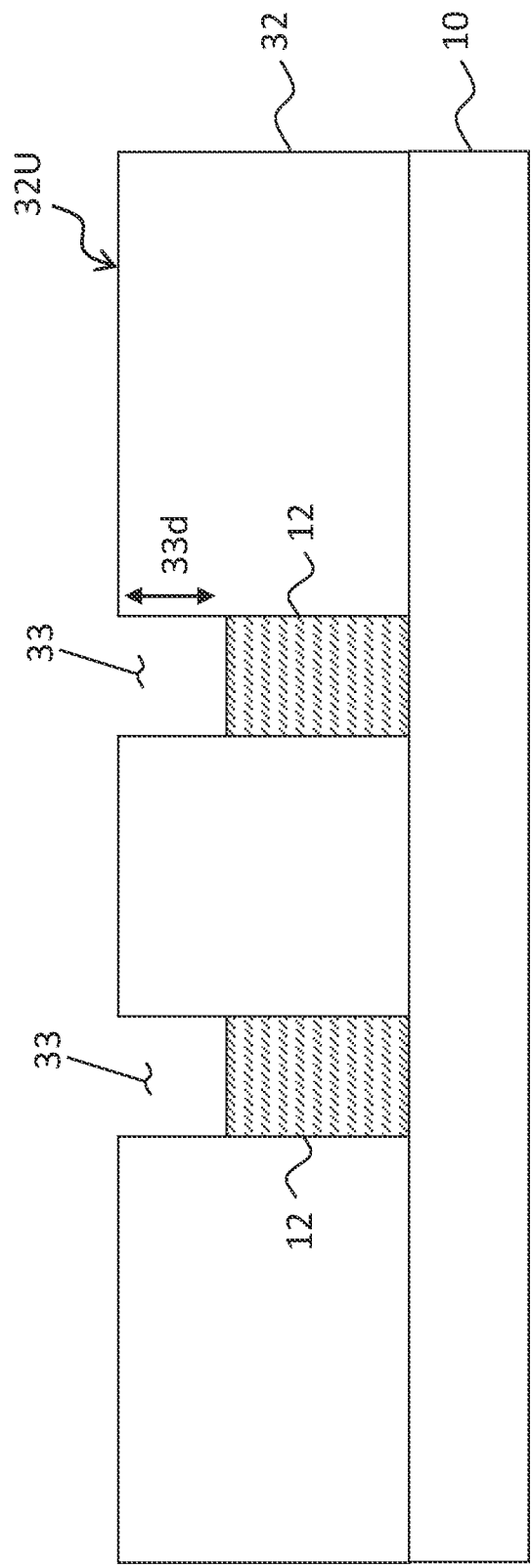
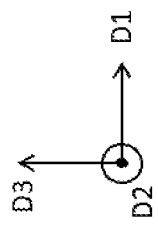
FIG. 8

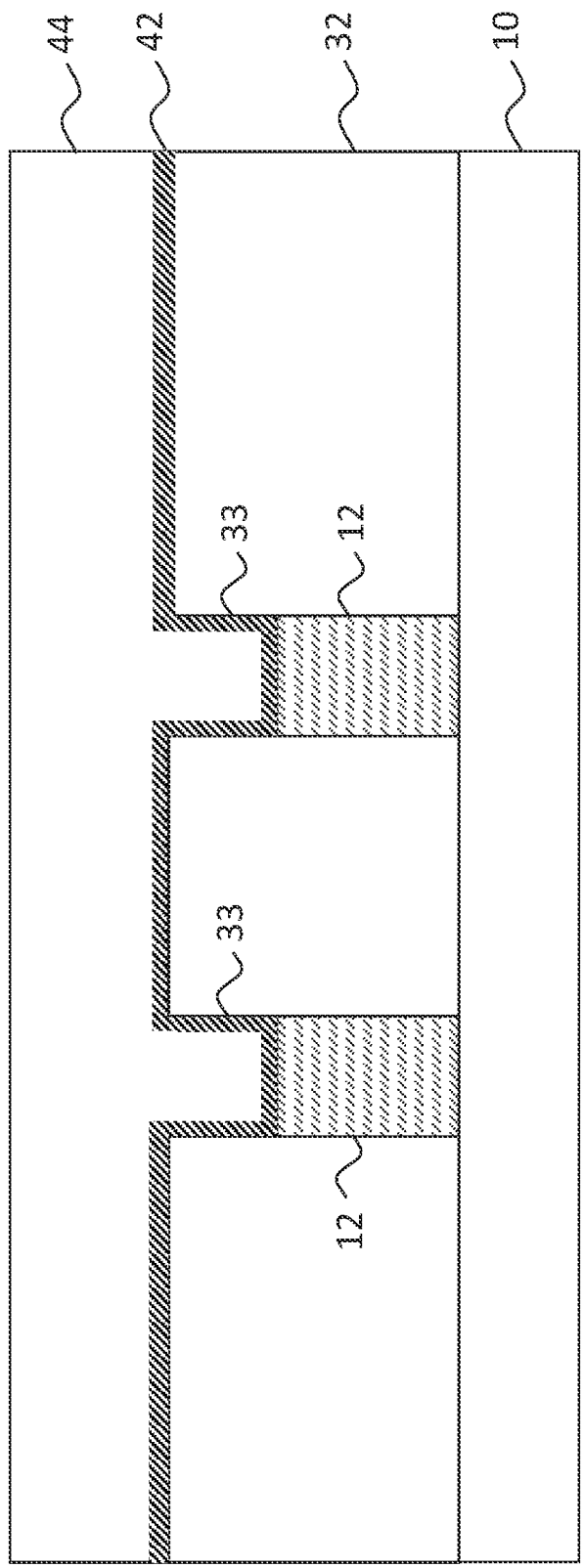
FIG. 9
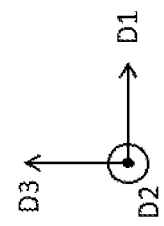

INTEGRATED CIRCUIT DEVICES INCLUDING A VIA AND METHODS OF FORMING THE SAME

CROSS-REFERENCE TO RELATED APPLICATION

This application claims priority to U.S. Provisional Application Ser. No. 63/242,193, entitled INTEGRATED CIRCUIT DEVICES INCLUDING FULLY ALIGNED VIA, filed in the USPTO on Sep. 9, 2021, the disclosure of which is hereby incorporated by reference herein in its entirety.

FIELD

The present disclosure generally relates to the field of electronics and, more particularly, to integrated circuit devices including a via.

BACKGROUND

Various via structures have been proposed to provide stable electrical connection between a via contact and a metal wire and to reduce the likelihood of an unintended electrical connection between the via contact and an adjacent conductive element.

SUMMARY

According to some embodiments of the present invention, methods of forming an integrated circuit device may include forming a conductive wire structure on a substrate. The conductive wire structure may include a first insulating layer and a conductive wire stack in the first insulating layer, and the conductive wire stack may include a conductive wire and a mask layer stacked on the substrate. The method may also include forming a recess in the first insulating layer by removing the mask layer, the recess exposing the conductive wire, forming an etch stop layer and then a second insulating layer on the first insulating layer and in the recess of the first insulating layer, and forming a conductive via extending through the second insulating layer and the etch stop layer and contacting the conductive wire.

According to some embodiments of the present invention, methods of forming an integrated circuit device may include forming a conductive wire stack on a substrate. The conductive wire stack may include a conductive wire and a mask layer stacked on the substrate. The methods may also include forming a first preliminary insulating layer on the conductive wire stack, forming a first insulating layer by performing a planarization process on the first preliminary insulating layer until the mask layer is exposed, forming a recess in the first insulating layer by removing the mask layer, the recess exposing the conductive wire, forming an etch stop layer and then a second insulating layer on the first insulating layer and in the recess of the first insulating layer, forming an opening extending through the second insulating layer and the etch stop layer, and forming a conductive via in the opening. The opening may expose a first portion of an upper surface of the conductive wire and a portion of an uppermost surface of the first insulating layer.

According to some embodiments of the present invention, integrated circuit devices may include a first insulating layer on a substrate, a second insulating layer on the first insulating layer, an etch stop layer between the first insulating layer and the second insulating layer, and a conductive wire in the first insulating layer. An upper surface of the conductive wire may be recessed toward the substrate with respect to an uppermost surface of the first insulating layer. The integrated circuit devices may also include a conductive via extending through the second insulating layer and the etch stop layer and contacting the upper surface of the conductive wire. The conductive via may contact a first portion of the upper surface of the conductive wire, and a portion of the etch stop layer may be between a second portion of the upper surface of the conductive wire and the second insulating layer and may contacts a side surface of the conductive via. In some embodiments, the etch stop layer may include an aluminum oxide layer and/or an aluminum oxynitride layer.

BRIEF DESCRIPTION OF THE DRAWINGS

FIGS. 4, 5, 6, 7, 8, 9, 10, 11, 12 and 13 are cross-sectional views illustrating methods of forming an integrated circuit device according to some embodiments of the present invention.

DETAILED DESCRIPTION

According to some embodiments of the present invention, lower conductive wires (e.g., first metal lines) may each include a recessed upper surface with respect to an upper surface of an insulating layer in which the lower conductive wires are present. The recessed upper surface of the lower conductive wire may increase a distance between the lower conductive wire and a via electrically connected to the adjacent lower conductive wire and thus may reduce the likelihood of an unintended electrical connection between the lower conductive wire and the via. The recessed upper surfaces of the lower conductive wires may be formed by selectively removing mask layers on the lower conductive wires such that a distance between the recessed upper surfaces of the lower conductive wires and the upper surface of the insulating layer may be more precisely controlled.

Figure 1:
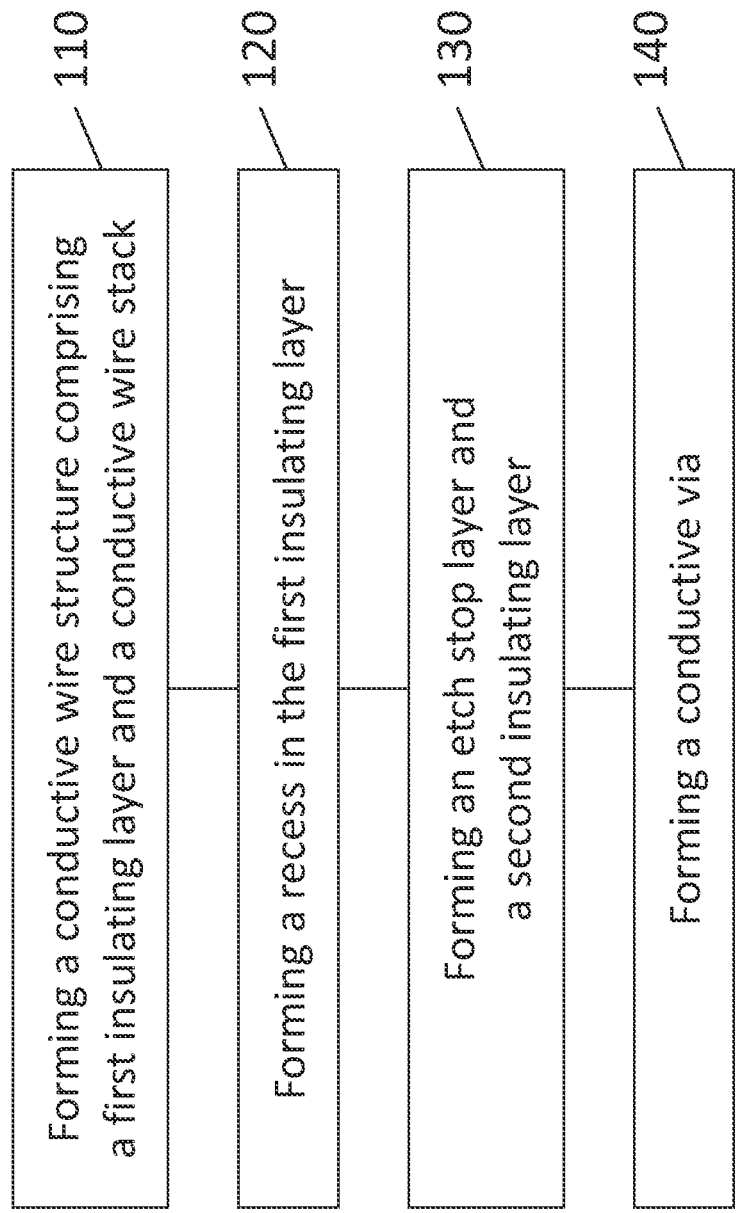
FIGS. 1, 2 and 3 are flow charts of methods of forming an integrated circuit device according to some embodiments of the present invention.
Figure 2:
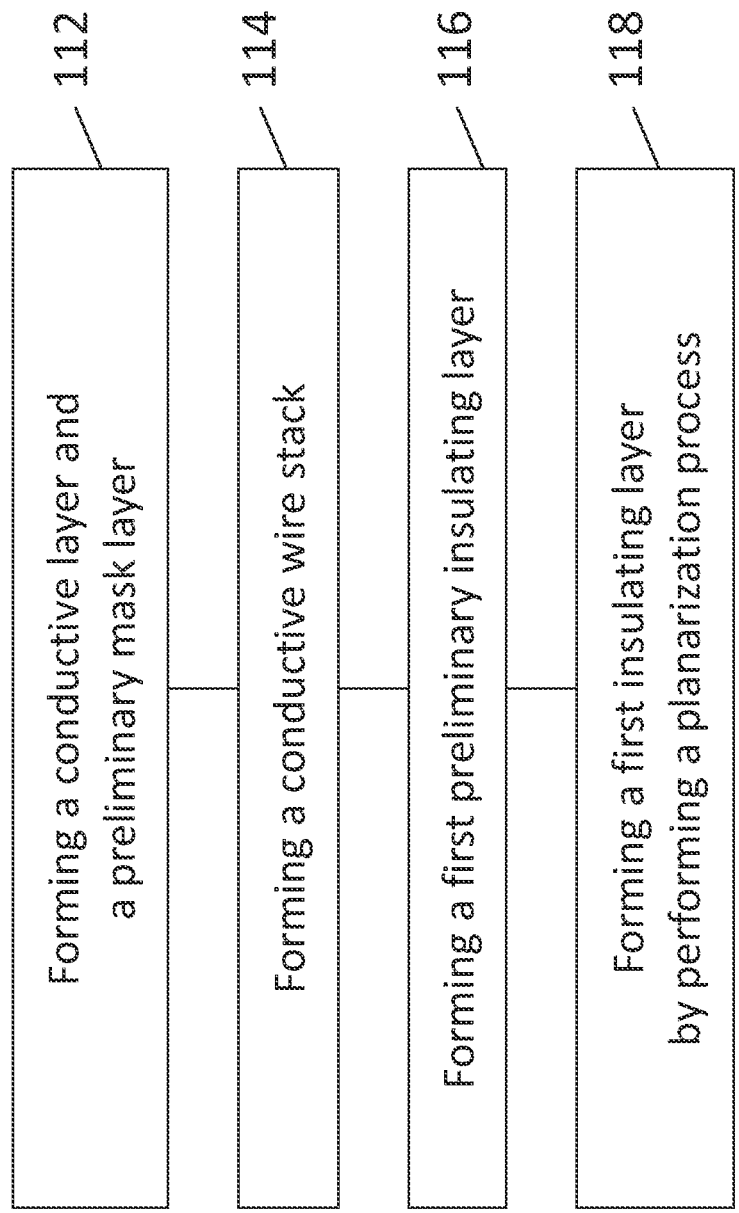
Figure 3:
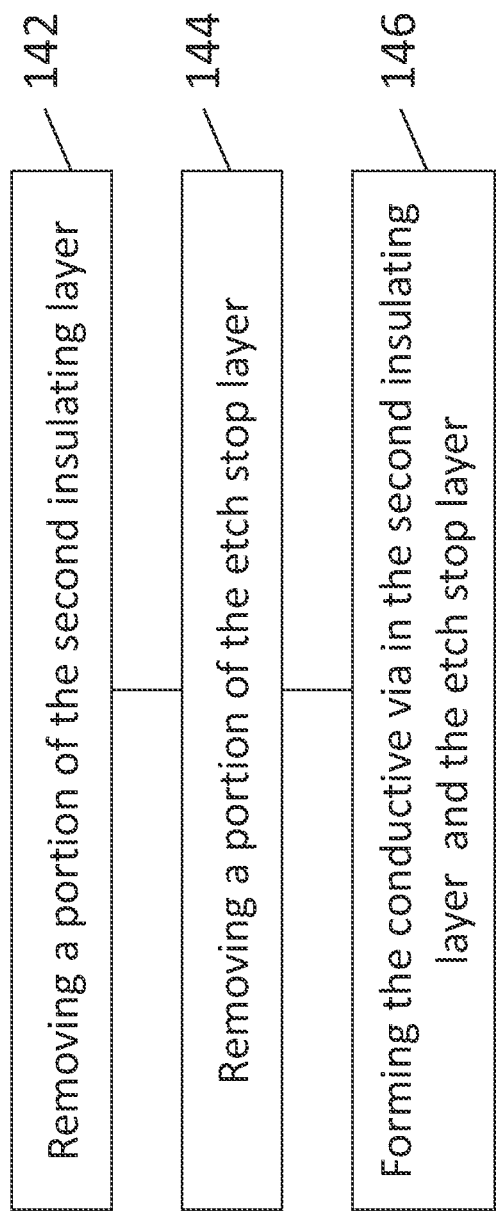

FIGS. 1, 2 and 3 are flow charts of methods of forming an integrated circuit device according to some embodiments of the present invention, and FIGS. 4 through 13 are cross-sectional views illustrating methods of forming an integrated circuit device according to some embodiments of the present invention.

Figure 4:
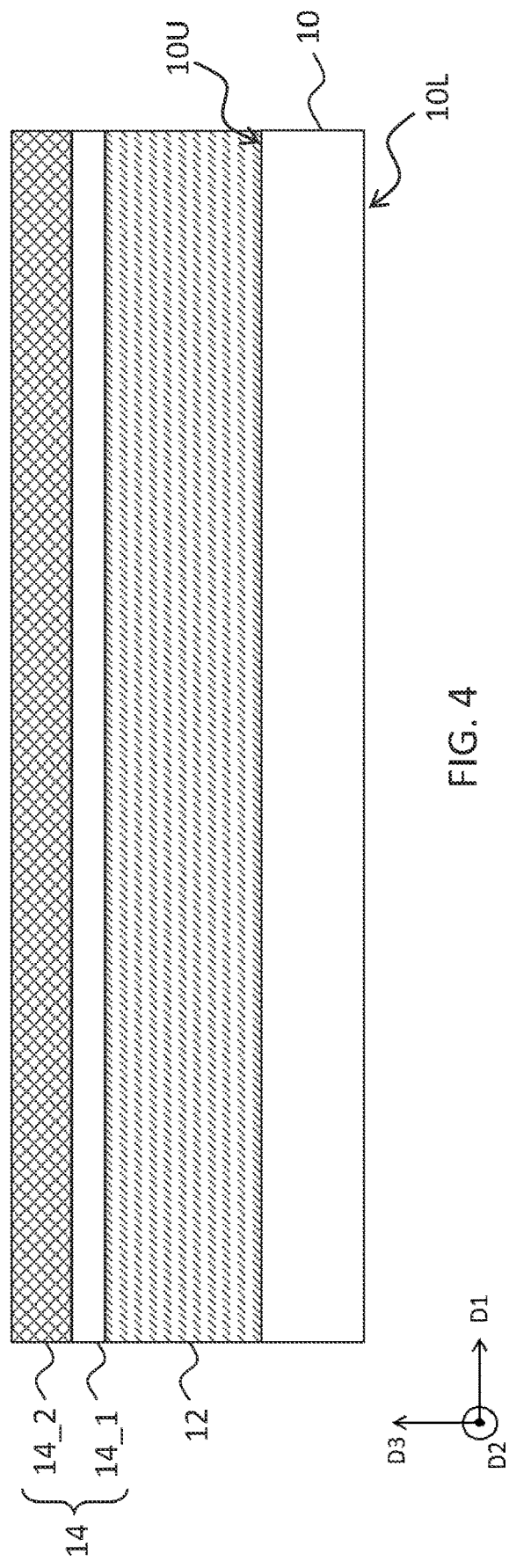

Referring to FIGS. 1, 2 and 4 through 7, the methods may include forming a conductive wire structure comprising a first insulating layer 32 and a conductive wire stack 24 on a substrate 10 (Block 110). In some embodiments, forming the conductive wire structure may include forming a conductive wire 12 and a mask layer 14 on the substrate 10 (Block 112). In some embodiments, the mask layer 14 may include a first mask layer 14_1 and a second mask layer 14_2. Although FIG. 4 illustrates the mask layer 14 including two stacked layers, the present invention is not limited thereto. The mask layer 14 may be a single layer or multiple layers including three or more layers.

The substrate 10 may include an upper surface 10U facing the conductive wire 12 and a lower surface 10L opposite the upper surface 10U. The upper surface 10U may be parallel to a first direction D1 and a second direction D2 that is different from the first direction D1. The first and second directions D1 and D2 may be a first horizontal direction and a second horizontal direction, respectively. The conductive wire 12 and the mask layer 14 may be sequentially stacked on the substrate 10 in a third direction D3. The third direction D3 may be perpendicular to the first and second directions D1 and D2 and may be a vertical direction.

The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate.

The conductive wire 12 may be a single layer or multiple layers sequentially stacked on the substrate 10. The conductive wire 12 may include a metal layer (e.g., a ruthenium layer, a molybdenum layer, a copper layer, an aluminum layer and/or a tungsten layer) and/or a metal nitride layer (e.g., a titanium nitride layer and/or a tantalum nitride layer). For example, the conductive wire 12 may be a ruthenium layer or a molybdenum layer.

The mask layer 14 may include layer(s) having an etch selectivity with respect to the conductive wire 12. In some embodiments, the mask layer 14 may include an organic hardmask layer and/or an inorganic hardmask layer. For example, the mask layer 14 may be a single silicon nitride layer or may be multiple layers (e.g., the first mask layer 14_1 and the second mask layer 14_2) stacked in the third direction D3.

Figure 5:
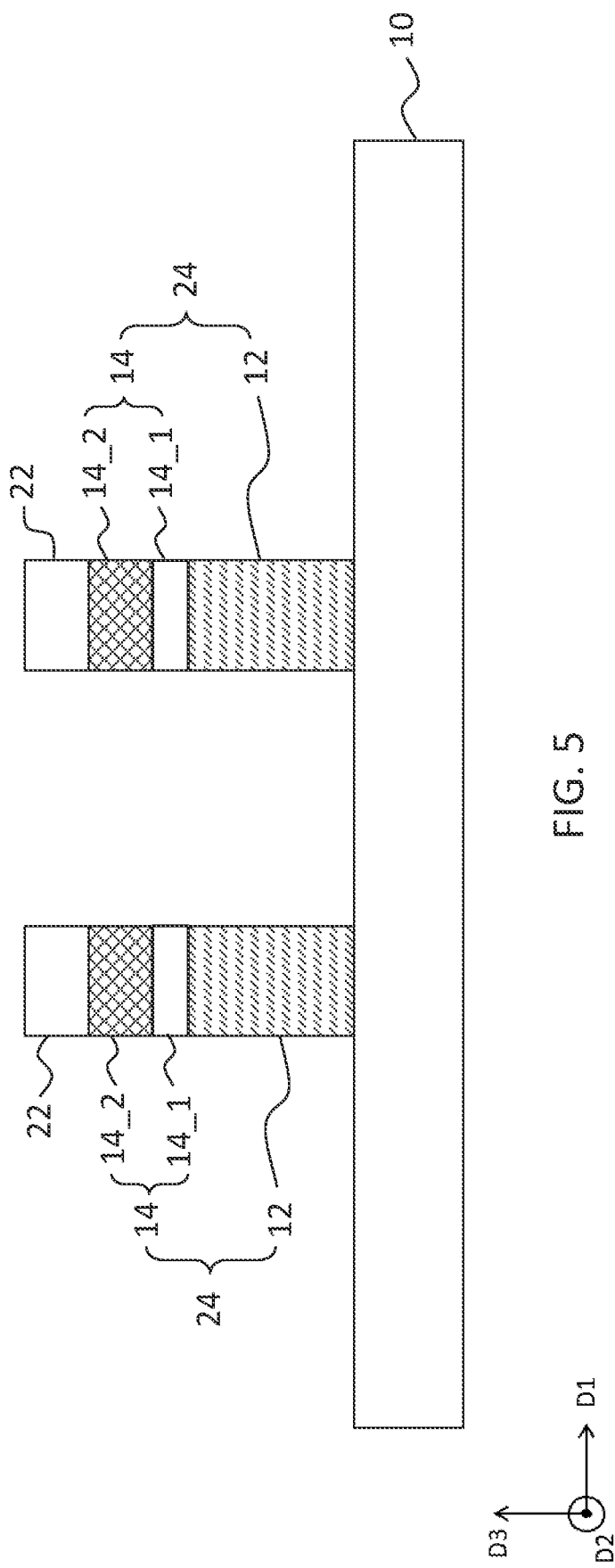

The first mask layer 14_1 may improve adhesion between the conductive wire 12 and the second mask layer 14_2 and may protect the conductive wire 12 while removing the first mask layer 14_1 during a subsequent process illustrated in FIG. 8. For example, the first mask layer 14_1 may have a thickness in a range of about 0.1 nanometers (nm) to 50 nm, and the second mask layer 14_2 may have a thickness in a range of about 5 nm to 50 nm. The first mask layer 14_1 may include a titanium nitride layer, an aluminum nitride layer and/or a titanium carbide layer, and the second mask layer 14_2 may include a silicon nitride layer. In some embodiments, the first mask layer 14_1 may be a titanium nitride layer, and the second mask layer 14_2 may be a silicon nitride layer. The mask layer 14 in FIG. 4 is patterned through a subsequent process as illustrated in FIG. 5 and may also be referred to as a preliminary mask layer. Further, the conductive wire 12 in FIG. 4 is patterned through a subsequent process as illustrated in FIG. 5 and may also be referred to as a conductive wire.

Referring to FIG. 5, forming the conductive wire structure may also include forming conductive wire stacks 24 by patterning the mask layer 14 and the conductive wire 12 (Block 114). In some embodiments, an additional mask layer 22 (e.g., a photoresist layer) may be formed on the mask layer 14 to pattern the mask layer 14 and the conductive wire 12. The additional mask layer 22 may be removed after the conductive wire stacks 24 are formed. In some embodiment, the additional mask layer 22 may be removed after the mask layer 14 is patterned, and then the mask layer 14 may be patterned using the mask layer 14 as an etch mask.

The mask layer 14 may include a first mask layer 14_1 and a second mask layer 14_2 sequentially stacked on the substrate 10 in the third direction D3. In some embodiments, each of the conductive wires 12 may extend longitudinally in the second direction D2.

Figure 6:
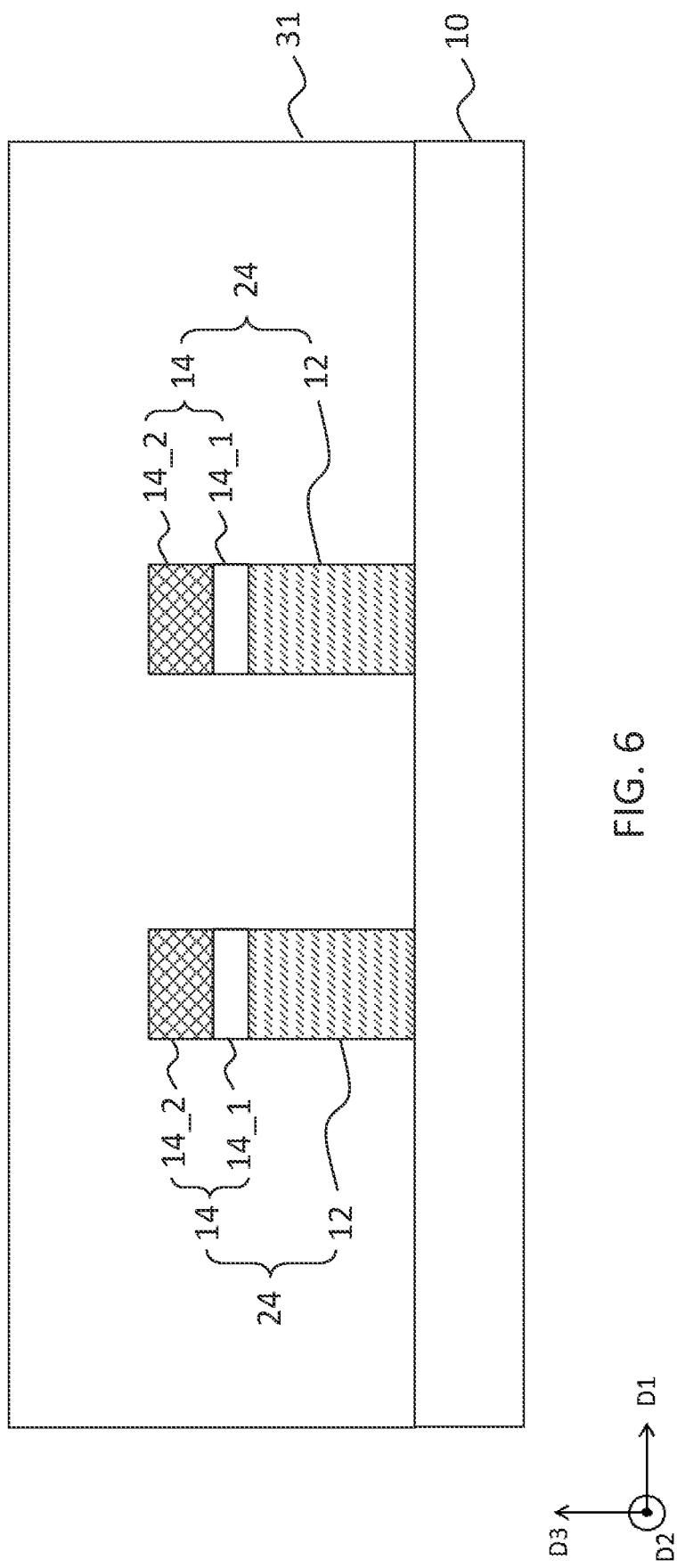

Referring to FIG. 6, a first preliminary insulating layer 31 may be formed on the conductive wire stacks 24 (Block 116). In some embodiments, the first preliminary insulating layer 31 may cover the conductive wire stacks 24 as illustrated in FIG. 6. The first preliminary insulating layer 31 may be a single layer or multiple layers and may include a silicon oxide layer, a silicon oxynitride layer, a silicon carbide layer, and/or a lower dielectric layer that has a dielectric constant lower than silicon dioxide.

Figure 7:
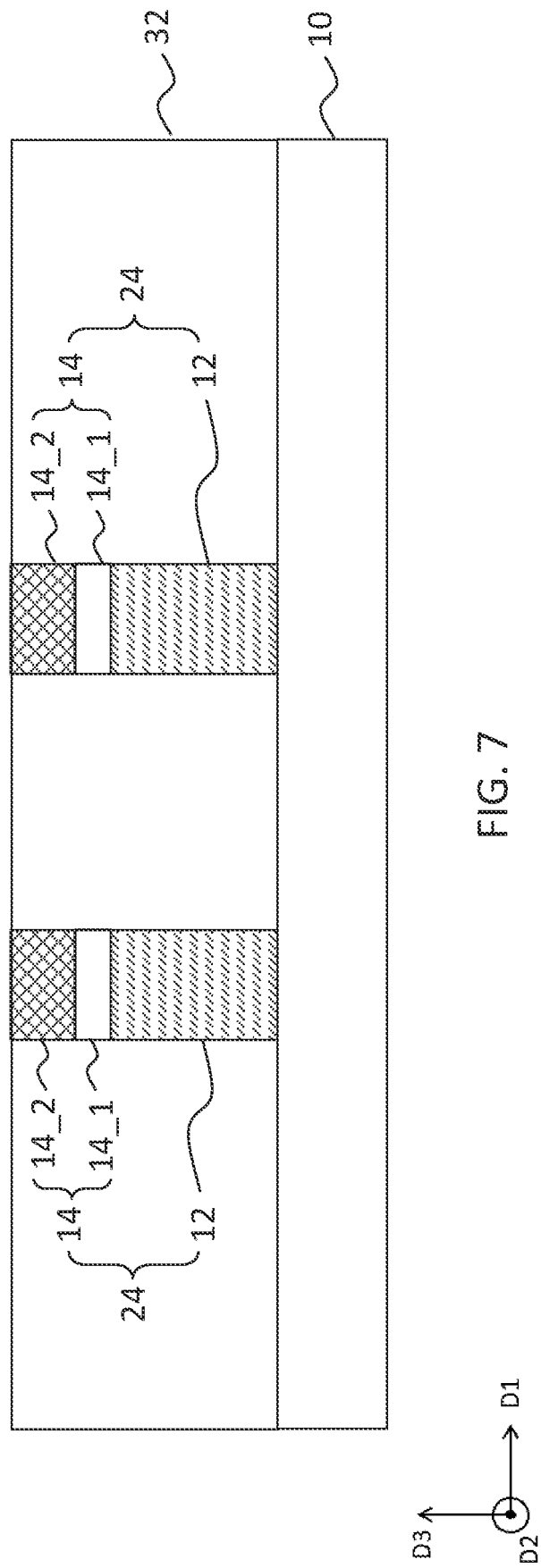
Figure 10:
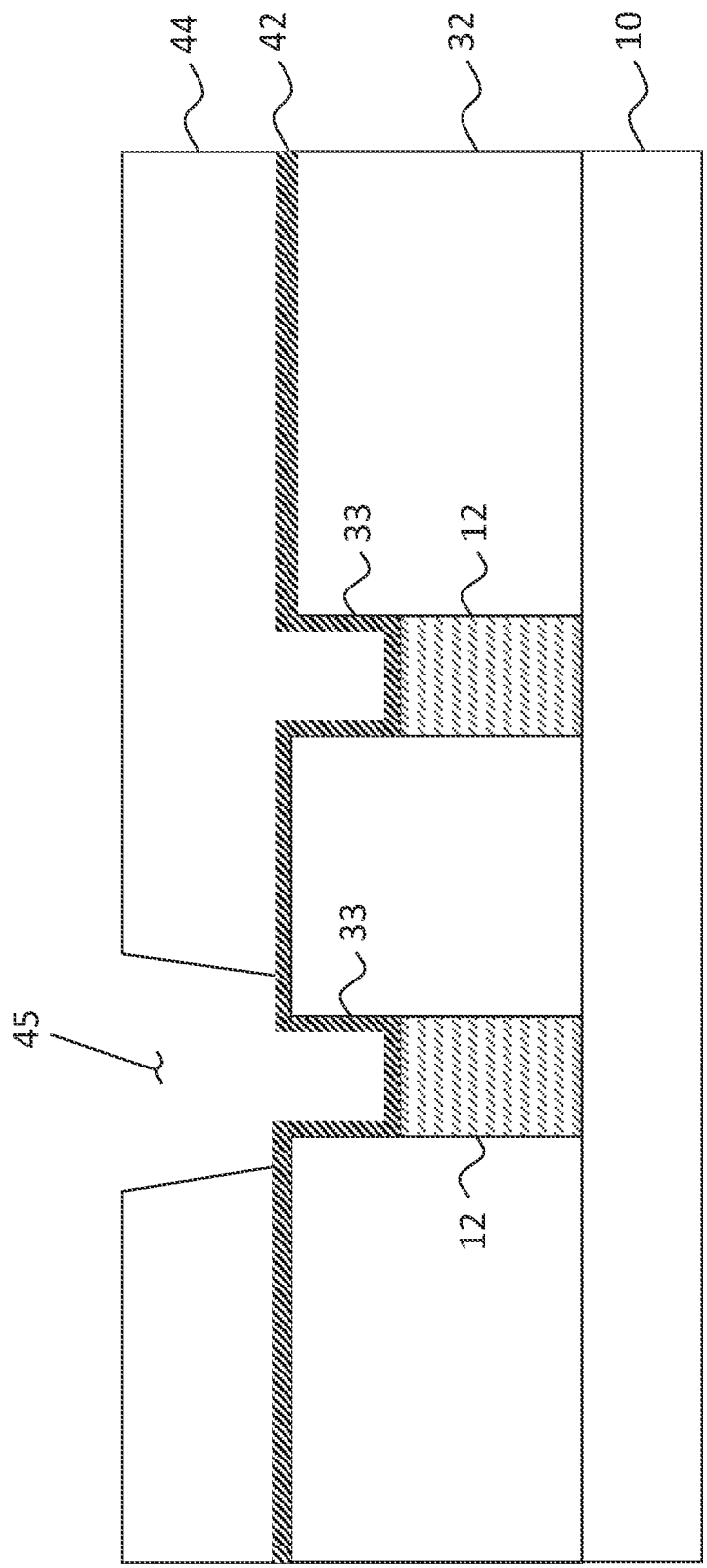

Referring to FIG. 7, a first insulating layer 32 may be formed on the conductive wire stacks 24 by removing an upper portion of the first preliminary insulating layer 31 (Block 118). In some embodiments, the upper portion of the first preliminary insulating layer 31 may be removed by a planarization process (e.g., a Chemical Mechanical Polishing (CMP) process, a dry etch process and/or a wet etch process) until an upper surface of the mask layer 14 is exposed. An upper surface of the first insulating layer 32 and the upper surface of the mask layer 14 may be coplanar with each other as illustrated in FIG. 7.

Referring to FIGS. 1 and 8, the methods may also include forming a recess 33 in the first insulating layer 32 by removing the mask layer 14 (Block 120). The mask layer 14 may be removed by one or more processes (e.g., a dry etch process and/or a wet etch process) that may selectively remove the mask layer 14 until an upper surface of the conductive wire 12 is exposed. For example, an isotropic reactive-ion etching (ME) process and/or a wet etch process using an etchant including phosphoric acid may be used to remove the mask layer 14. In some embodiments, the etchant may be heated to a temperature ranging from about 50° C. to about 200° C. The recess 33 may have a depth 33d. The mask layer 14 may be selectively removed with respect to both the conductive wire 12 and the first insulating layer 32.

In some embodiments, the mask layer 14 may be completely removed and thus the entire upper surface of the conductive wire 12 may be exposed. Process conditions and chemistries may be selected to avoid removing a substantial portion of the conductive wire 12. Less than 5% (e.g., 1%) of a thickness of the conductive wire 12 in the third direction D3 may be removed while removing the mask layer 14.

Referring to FIGS. 1 and 9, the methods may further include forming an etch stop layer 42 and a second insulating layer 44 on the first insulating layer 32 (i.e., on an uppermost surface of the first insulating layer 32) and in the recess 33 (Block 130). In some embodiments, the etch stop layer 42 may have a uniform thickness along a surface of an underlying structure as illustrated in FIG. 9, and the etch stop layer 42 may not completely fill the recess 33. The etch stop layer 42 may include, for example, an aluminum oxide layer, an aluminum nitride layer, and/or an aluminum oxynitride layer, and the aluminum oxide layer may include metal dopants (e.g., hafnium, zirconium, titanium and/or heavy transition metal) at a concentration in a range of 0.01 at % to 50 at %.

Figure 11:
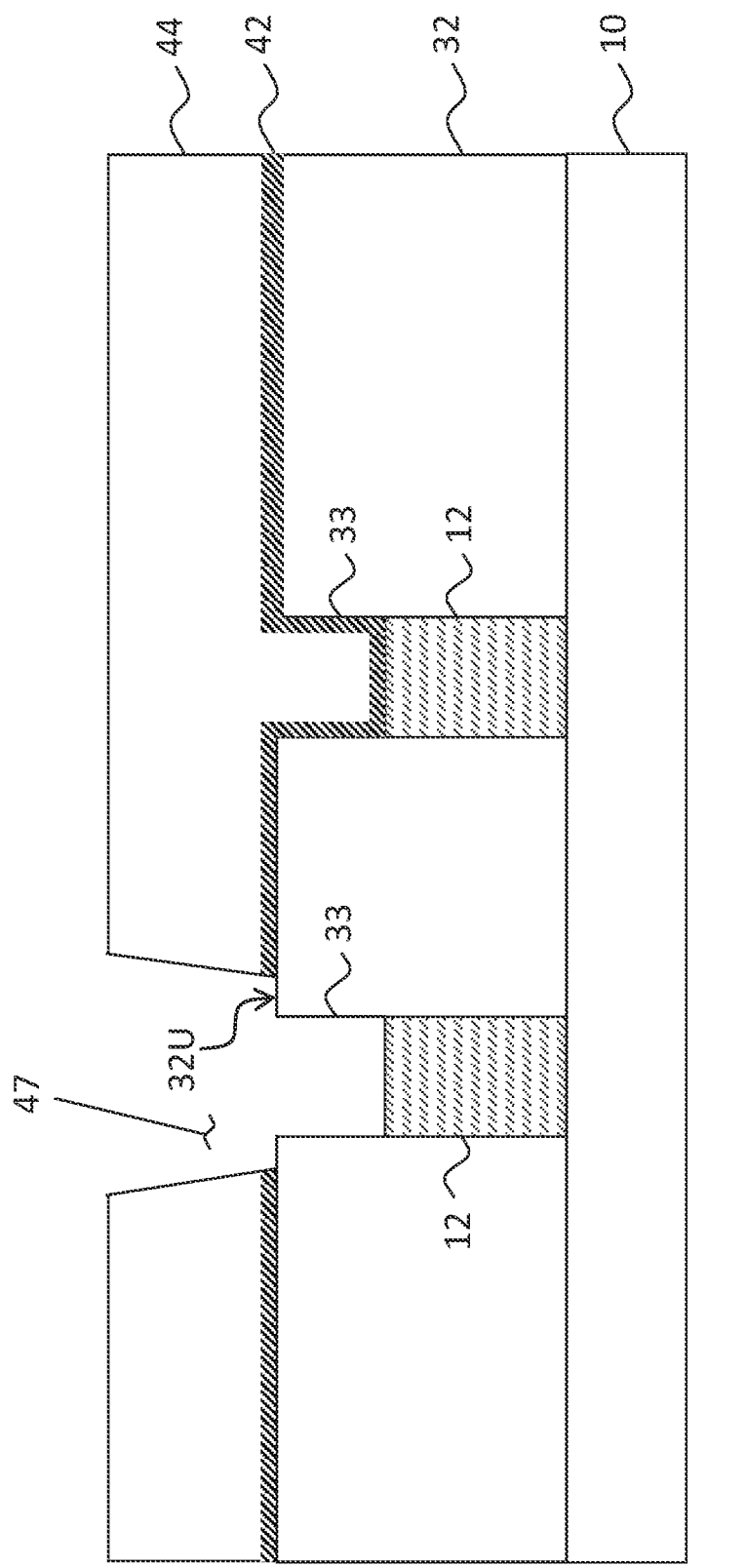

Referring to FIGS. 1, 3 and 9 through 12, the methods may additionally include forming a conductive via 48 on the conductive wire 12 (Block 140). Forming the conductive via 48 may include removing a portion of the second insulating layer 44 until the etch stop layer 42 is exposed, thereby forming a preliminary opening 45 in the second insulating layer 44 (Block 142) and removing a portion of the etch stop layer 42 until exposing the conductive wire 12, thereby forming an opening 47 (Block 144). In some embodiments, as illustrated in FIG. 11, the opening 47 may expose a portion of the uppermost surface 32U of the first insulating layer 32. Further, in some embodiments, a center of the recess 33 in the first direction D1 and a center of the opening 47 in the first direction D1 may be aligned with each other as illustrated in FIG. 11.

The portions of the second insulating layer 44 and the etch stop layer 42 that are removed may be removed by performing an etch process (e.g., a dry etch and/or a wet etch process). In some embodiments, the portion of the etch stop layer 42 may be removed by an isotropic etch process (e.g., a wet etch process) to reduce damage to the conductive wire 12 while removing the portion of the etch stop layer 42. In some embodiments, an RIE process may not be used to remove the portion of the etch stop layer 42.

Figure 12:
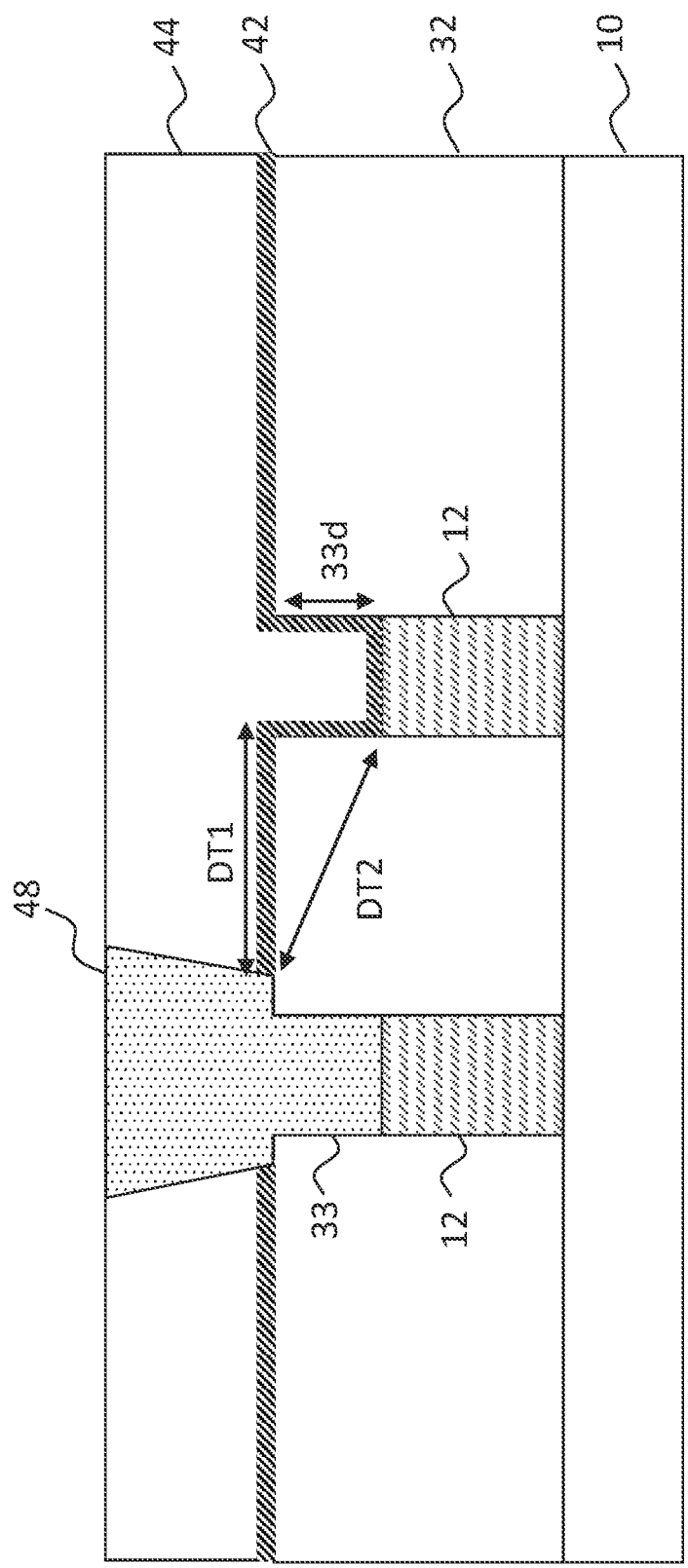

Forming the conductive via 48 may also include forming the conductive via 48 in the opening 47 (Block 146). The conductive via 48 may be formed by forming conductive layer(s) in the opening 47 and on the second insulating layer 44 and then removing a portion of the conductive layer(s) formed on the second insulating layer 44 by performing, for example, a CMP process, a dry etch process and/or a wet etch process. An upper surface of the conductive via 48 may be coplanar with an upper surface of the second insulating layer 44. Although FIG. 12 illustrates the conductive via 48 as a single layer, the present invention is not limited thereto. In some embodiments, the conductive via 48 may include multiple layers (e.g., a barrier metal layer and/or a metal layer).

As illustrated in FIG. 12, a distance between a portion of the conductive via 48 on the first insulating layer 32 (i.e., an upper portion of the conductive via 48) and the adjacent conductive wire 12 may increase due to the recess 33. If the conductive wire 12 is not recessed with respect to the first insulating layer 32, the upper portion of the conductive via 48 and the adjacent conductive wire 12 may be spaced apart from each other by a first distance DT1 that is shorter than a second distance DT2 in a device according to some embodiments of the present invention. The second distance DT2 may be proportional to the depth 33*d* of the recess 33.

Figure 13:
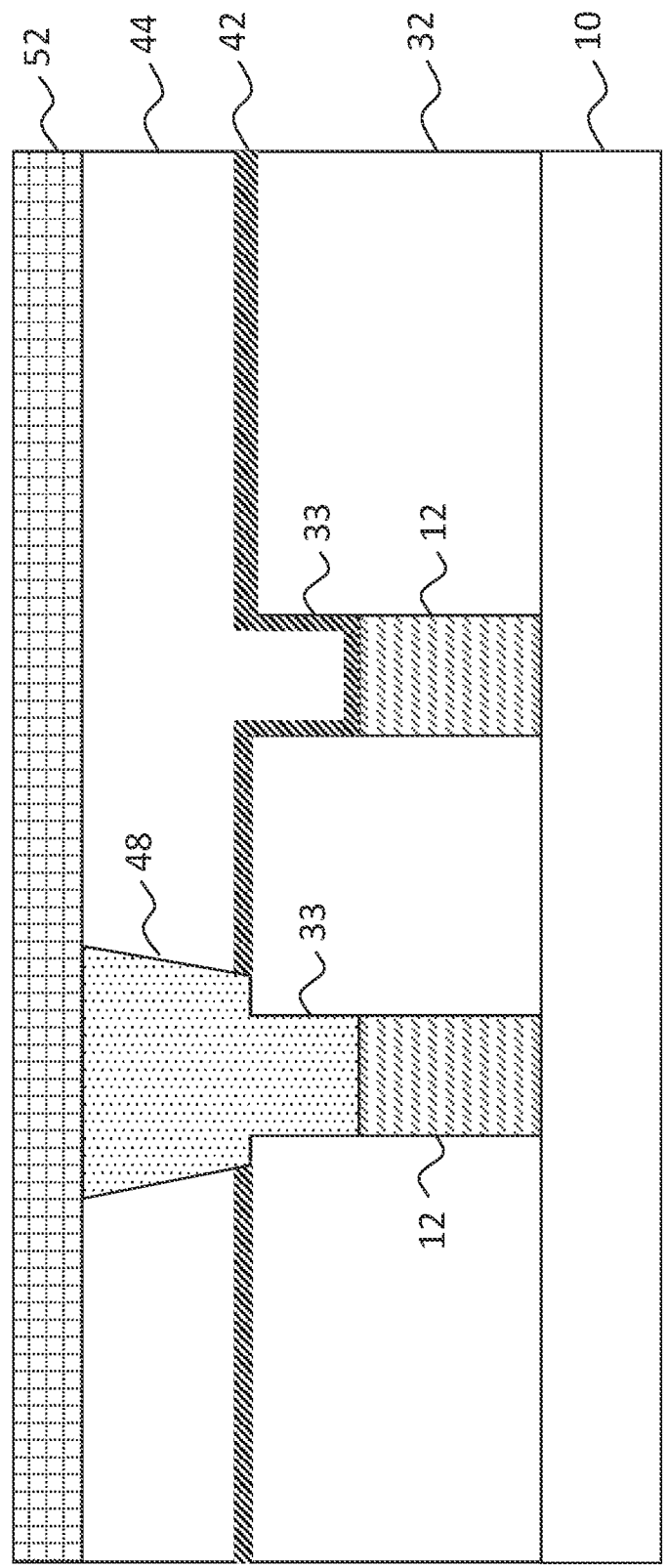

Referring to FIG. 13, a second conductive layer 52 may be formed on the conductive via 48. The conductive layer 52 may contact the upper surface of the conductive via 48 and may extend longitudinally in the first direction D1. Each of the conductive via 48 and the second conductive layer 52 may include a metal layer (e.g., a ruthenium layer, a molybdenum layer, a copper layer, an aluminum layer and/or a tungsten layer) and/or a metal nitride layer (e.g., a titanium nitride layer and/or a tantalum nitride layer).

Figure 14:
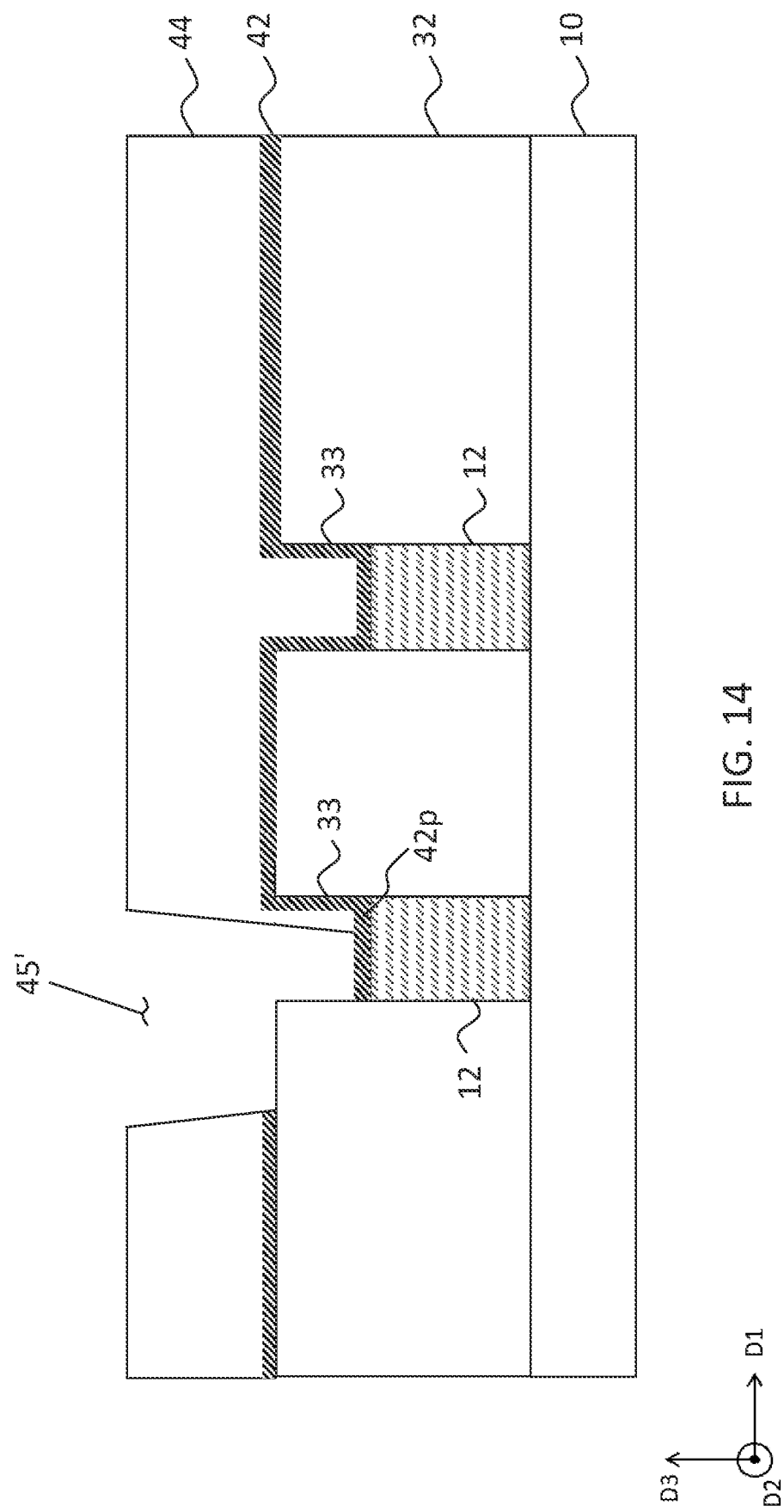
FIGS. 14, 15 and 16 are cross-sectional views illustrating methods of forming an integrated circuit device according to some embodiments of the present invention.
Figure 15:
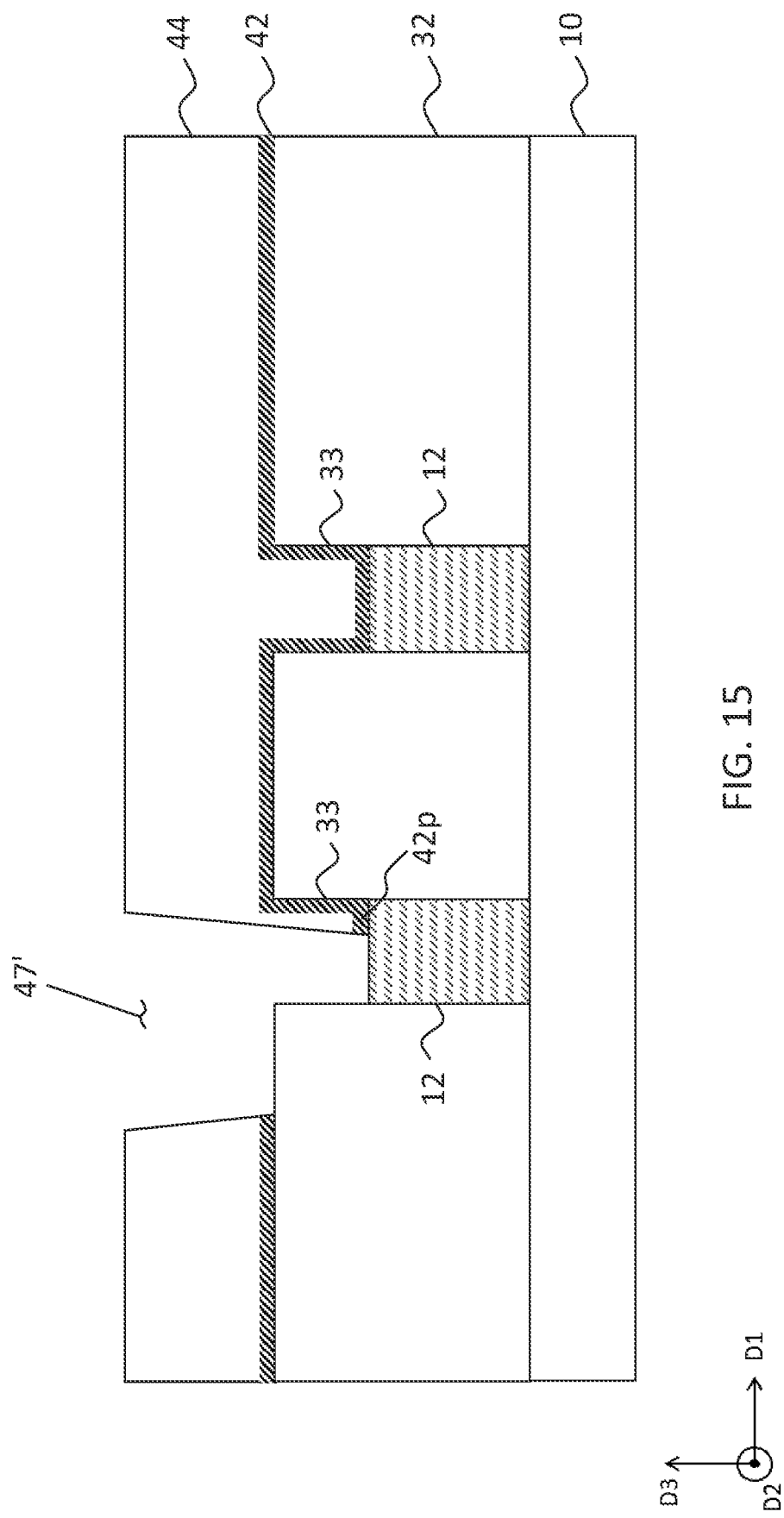
Figure 16:
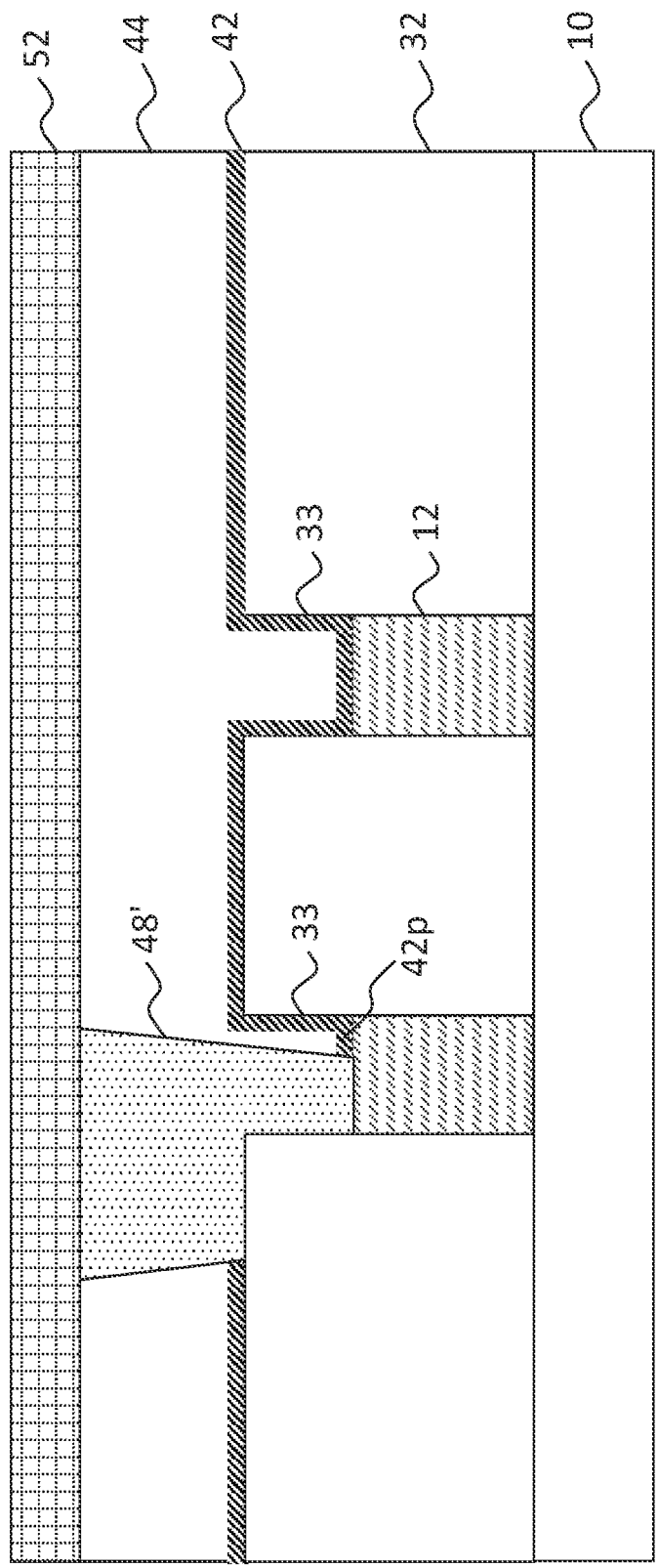

FIGS. 14 through 16 are cross-sectional views illustrating methods of forming an integrated circuit device according to some embodiments of the present invention. The methods may be similar to or the same as those described with reference to FIGS. 4 through 13 with a primary difference being that the center of the recess 33 may be offset from a center of the opening 47' in the first direction D1 as illustrated in FIG. 16.

The methods may include processes that are the same as or similar to those described with reference to FIGS. 4 through 9 and may also include forming a preliminary opening 45' extending through the second insulating layer 44 as illustrated in FIG. 14 and forming an opening 47' exposing a portion of an upper surface of the conductive wire 12. As the center of the opening 47' is offset from the center of the recess 33, the opening 47' may not expose a portion of the upper surface of the conductive wire 12, and a portion 42*p* of the etch stop layer 42 may remain between the conductive wire 12 and the second insulating layer 44 as illustrated in FIG. 15.

Referring to FIG. 16, The methods may further include forming a conductive via 48' in the opening 47'. The portion 42*p* of the etch stop layer 42 may contact a side surface of the conductive via 48' as illustrated in FIG. 16.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present invention.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. A method of forming an integrated circuit device, the method comprising:
    forming a conductive wire structure on a substrate, the conductive wire structure comprising a first insulating layer and a conductive wire stack in the first insulating layer, and the conductive wire stack comprising a conductive wire and a mask layer stacked on the substrate;

forming a recess in the first insulating layer by removing the mask layer, the recess exposing the conductive wire;

forming an etch stop layer and then a second insulating layer on the first insulating layer and in the recess of the first insulating layer; and forming a conductive via extending through the second insulating layer and the etch stop layer and contacting the conductive wire.

2. The method of claim 1, wherein the mask layer comprises an organic hardmask layer and/or an inorganic hardmask layer.

3. The method of claim 2, wherein the mask layer is a single silicon nitride layer or comprises a first mask layer and a second mask layer stacked on the conductive wire, and the first mask layer comprises a titanium nitride layer, an aluminum nitride layer and/or a titanium carbide layer, and the second mask layer comprises a silicon nitride layer.

4. The method of claim 1, wherein an upper surface of the first insulating layer and an upper surface of the mask layer are coplanar with each other.

5. The method of claim 1, wherein forming the conductive via comprises:

forming an opening extending through the second insulating layer and the etch stop layer, the opening exposing the conductive wire; and forming the conductive via in the opening.

6. The method of claim 5, wherein forming the opening comprises:

removing a portion of the second insulating layer until the etch stop layer is exposed by performing a first etch process; and then removing a portion of the etch stop layer until the conductive wire is exposed by performing a second etch process that is an isotropic etch process.

7. The method of claim 6, wherein the second etch process is a wet etch process.

8. The method of claim 1, wherein the etch stop layer comprises an aluminum oxide layer, an aluminum nitride layer, and/or an aluminum oxynitride layer.

9. The method of claim 1, wherein forming the conductive wire structure comprises:

forming a conductive layer and then the mask layer on the substrate;

forming the conductive wire by patterning the conductive layer using the mask layer as an etch mask;

forming a first preliminary insulating layer on the conductive wire and the mask layer; and performing a planarization process on the first preliminary insulating layer until the mask layer is exposed.

10. A method of forming an integrated circuit device, the method comprising:

forming a conductive wire stack on a substrate, the conductive wire stack comprising a conductive wire and a mask layer stacked on the substrate;

forming a first preliminary insulating layer on the conductive wire stack;

forming a first insulating layer by performing a planarization process on the first preliminary insulating layer until the mask layer is exposed;

forming a recess in the first insulating layer by removing the mask layer, the recess exposing the conductive wire;

forming an etch stop layer and then a second insulating layer on the first insulating layer and in the recess of the first insulating layer;

forming an opening extending through the second insulating layer and the etch stop layer, the opening exposing a first portion of an upper surface of the conductive wire and a portion of an uppermost surface of the first insulating layer; and forming a conductive via in the opening.

11. The method of claim 10, wherein the mask layer is a single silicon nitride layer or comprises a first mask layer and a second mask layer stacked on the conductive wire, and the first mask layer comprises a titanium nitride layer, an aluminum nitride layer and/or a titanium carbide layer, and the second mask layer comprises a silicon nitride layer.

12. The method of claim 10, wherein the conductive wire comprises ruthenium and/or molybdenum.

13. The method of claim 10, wherein the etch stop layer comprises an aluminum oxide layer, an aluminum nitride layer, and/or an aluminum oxynitride layer.

14. The method of claim 10, wherein the etch stop layer has a uniform thickness on the first insulating layer and in the recess of the first insulating layer before forming the opening.

15. The method of claim 10, wherein forming the opening comprises:

removing a portion of the second insulating layer until the etch stop layer is exposed by performing a first etch process; and then removing a portion of the etch stop layer until the conductive wire is exposed by performing a second etch process that is an isotropic etch process.

16. The method of claim 10, wherein the conductive via contacts the portion of the uppermost surface of the first insulating layer.

17. The method of claim 10, wherein the conductive via contacts the first portion of the upper surface of the conductive wire, and a portion of the etch stop layer is between a second portion of the upper surface of the conductive wire and the second insulating layer and contacts a side surface of the conductive via.

* * * * *